(12) United States Patent
Lin et al.

(10) Patent No.: US 11,855,629 B2
(45) Date of Patent: Dec. 26, 2023

(54) SELF TIMED LEVEL SHIFTER CIRCUIT

(71) Applicant: Taiwan Semiconductor Manufacturing Company Limited, Hsinchu (TW)

(72) Inventors: Wan-Yen Lin, Kaohsiung (TW); Tsung-Hsin Yu, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 360 days.

(21) Appl. No.: 17/140,292

(22) Filed: Jan. 4, 2021

(65) Prior Publication Data

US 2021/0336620 A1    Oct. 28, 2021

Related U.S. Application Data

(60) Provisional application No. 63/014,736, filed on Apr. 24, 2020.

(51) Int. Cl.
*H03K 19/0185* (2006.01)
*H03K 3/037* (2006.01)
*H03K 3/356* (2006.01)

(52) U.S. Cl.
CPC ..... *H03K 19/018507* (2013.01); *H03K 3/037* (2013.01); *H03K 3/356182* (2013.01)

(58) Field of Classification Search
CPC .......... H03K 19/018507; H03K 3/037; H03K 3/012; H03K 3/356182; H03K 3/35613; H03K 19/018514; H03K 19/018521; H03K 19/018528; H03K 3/356113; H03K 3/356139; H03K 3/356165; H03K 3/356173; H03K 3/356191
See application file for complete search history.

(56) References Cited

U.S. PATENT DOCUMENTS

2005/0168241 A1*  8/2005  Kim ................. H03K 3/356113
326/81

* cited by examiner

*Primary Examiner* — Jung Kim
(74) *Attorney, Agent, or Firm* — Jones Day

(57) ABSTRACT

Systems and methods are provided for a level shifter. A level shifter includes a network of transistors configured to receive a signal at a first node in a first voltage domain and to generate a corresponding signal at a second node in a second voltage domain during a transition period of time. A self timing circuit is configured to receive an initiation signal based on the signal at the first node and to generate a voltage transition accelerator signal that is used to pull up the second node prior to the expiration of the transition period of time.

20 Claims, 9 Drawing Sheets

United States Patent US 11,855,629 B2

SELF TIMED LEVEL SHIFTER CIRCUIT

CROSS-REFERENCE TO RELATED APPLICATIONS

This application claims priority to U.S. Provisional Application No. 63/014,736, Apr. 24, 2020, entitled "Self-Timed Level Shifter Circuit" which is incorporated herein by reference in its entirety.

TECHNICAL FIELD

This disclosure is integrated circuit signal processing and specifically to integrated circuit level shifters.

BACKGROUND

It is not uncommon for logic portions of an integrated circuit (e.g., a logic cell) to operate at a first voltage range (e.g., a low voltage domain, where logic can be performed at low voltages to maximize power performance of devices, including prolonging battery life), where other portions of the integrated circuit (e.g., input/output (IO) cells) operate at a different, possibly higher voltage (e.g., a high voltage domain using voltage ranges for appropriately interacting with circuitry external to the integrated circuit).

BRIEF DESCRIPTION OF THE DRAWINGS

Aspects of the present disclosure are best understood from the following detailed description when read with the accompanying figures.

DETAILED DESCRIPTION

Figure 1:
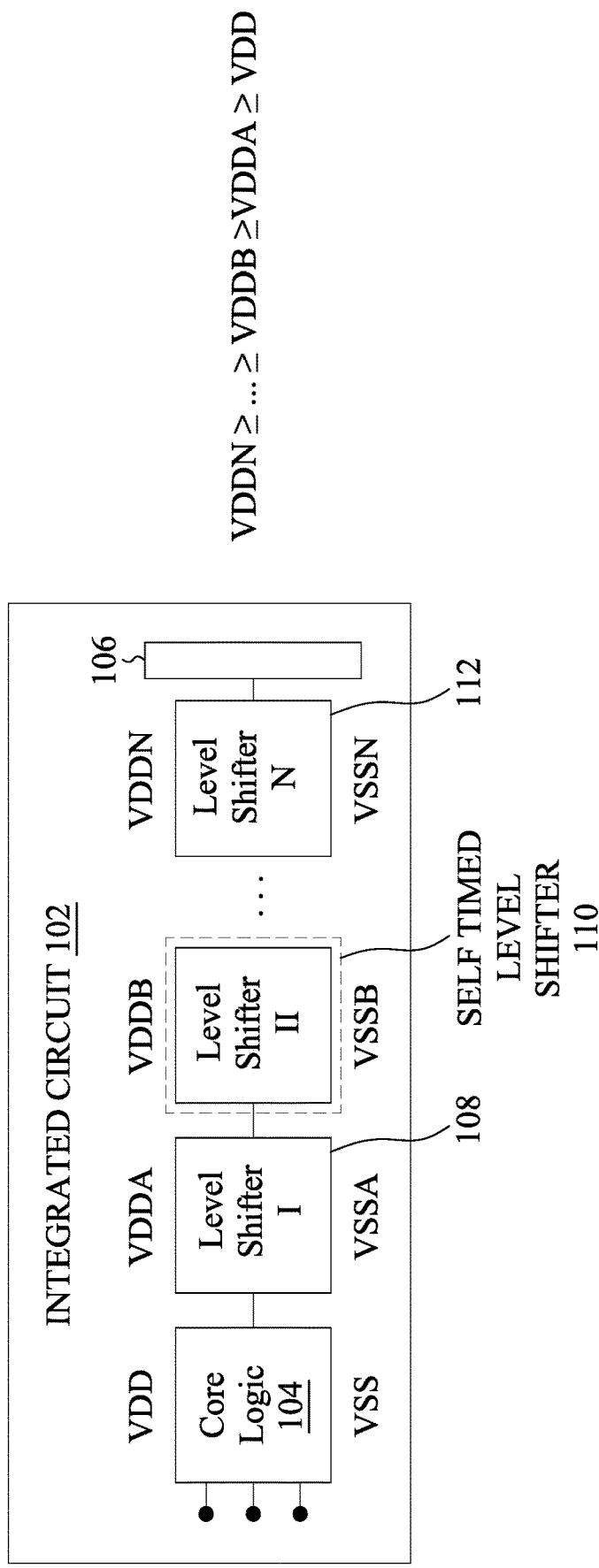
FIG. 1 is a diagram depicting a series of level shifters including a self timed level shifter at a second level in accordance with embodiments.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

As noted above, it is not uncommon for logic portions of an integrated circuit (e.g., a logic cell) to operate in a first voltage domain, where other portions of the integrated circuit (e.g., IO portions) operate in a different voltage domain. The present disclosure describes systems and methods associated with level shifting devices, certain embodiments having self-timing circuit portions for improving level shifting operation speed while protecting level shifting circuitry from damage. Level shifters, including overdrive level shifters that shift signals to voltage domains having signal spacing greater than transistor ratings (e.g., a 0 V-1.8 V domain using 1.2 V rated transistors), provide signal level transitions between voltage domains. For example, a level shifter may be configured to transition a low voltage domain signal representing a logic cell output to a high voltage domain signal output from the integrated circuit such that the output signal can be sensed by connected external circuitry. Or the level shifter may be configured to transition a high voltage domain input signal to the integrated circuit to the low voltage domain of the logic cell so as to not damage the logic cell. But a level shifter can introduce a potential bottleneck into an integrated circuit system, where level shifter transaction lag can limit operation speed (e.g., integrated circuit IO operations may be limited by level shifter switching speeds). And efforts to speed level shifter operation can result in circuitry damaging voltage overshoots.

FIG. 1 is a diagram depicting a series of level shifters including a self timed level shifter at a second level in accordance with embodiments. An integrated circuit 102 includes core logic 104 that implements the base functionality of the integrated circuit 102, such as receiving data, processing that data, and outputting results data. The core logic 104 operates in a base voltage domain, where a high voltage in the base voltage domain is at VDD and a low voltage in the base voltage domain is at VSS. While the core logic 104 operates at typically low voltage levels (e.g., the base voltage domain ranging from 0.0 V to 0.5 V), other circuitry of the integrated circuit 102 may operate at higher voltage levels. For example, IO circuitry 106 that interfaces with components external to the integrated circuit 102 may operate in a higher voltage domain (e.g., a high voltage domain ranging from 0.0 V to 1.8 V). That higher voltage domain may be helpful in meeting specifications of that external circuitry or to mitigate effects of signal attenuation during transmission of data from the integrated circuit 102 via the IO circuitry 106.

Level shifters I, II, N 108, 110, 112 are configured to transition signals to/from the base voltage domain of the core logic 104 from/to the high voltage domain of the IO circuitry 106. In embodiments, that transition is performed in multiple steps. Multiple stages of level shifting may be particularly useful where the voltage width of the IO circuitry (e.g., 1.8 V-0.0 V=1.8 V) is greater than the rating of transistors within the level shifters 108, 110, 112 (e.g., transistors rated for a maximum of 1.2 V). The process of using relatively low voltage rated transistors to generate transitions to/from high-voltage-width voltage domains is referred to herein as overdriving the level shifters. In embodiments, this is accomplished by operating each level shifter 108, 110, 112 at intermediate voltage domains having voltage widths no greater than the voltage rating of the transistors (e.g., VDDA-VSSA<1.2 V; VDDB-VSSB<1.2 V; VDDN-VSSN<1.2 V), where high side logic and low side logic can provide appropriately spaced high voltage domain signals at the IO circuitry 106.

In embodiments, one or more of the level shifters 108, 110, 112 may be a self timed level shifter 110. A self timed level shifter includes self timing modules that are configured to supplement pull up operations on certain target nodes within the level shifter to speed operation. Level shifters can be bottlenecks in integrated circuit IO operations, and where a level shifter experiences diminished performance (e.g., in certain conditions such as −40 degrees Celsius or more; more than +125 degrees Celsius), self timing modules can mitigate deteriorated IO performance.

Figure 2:
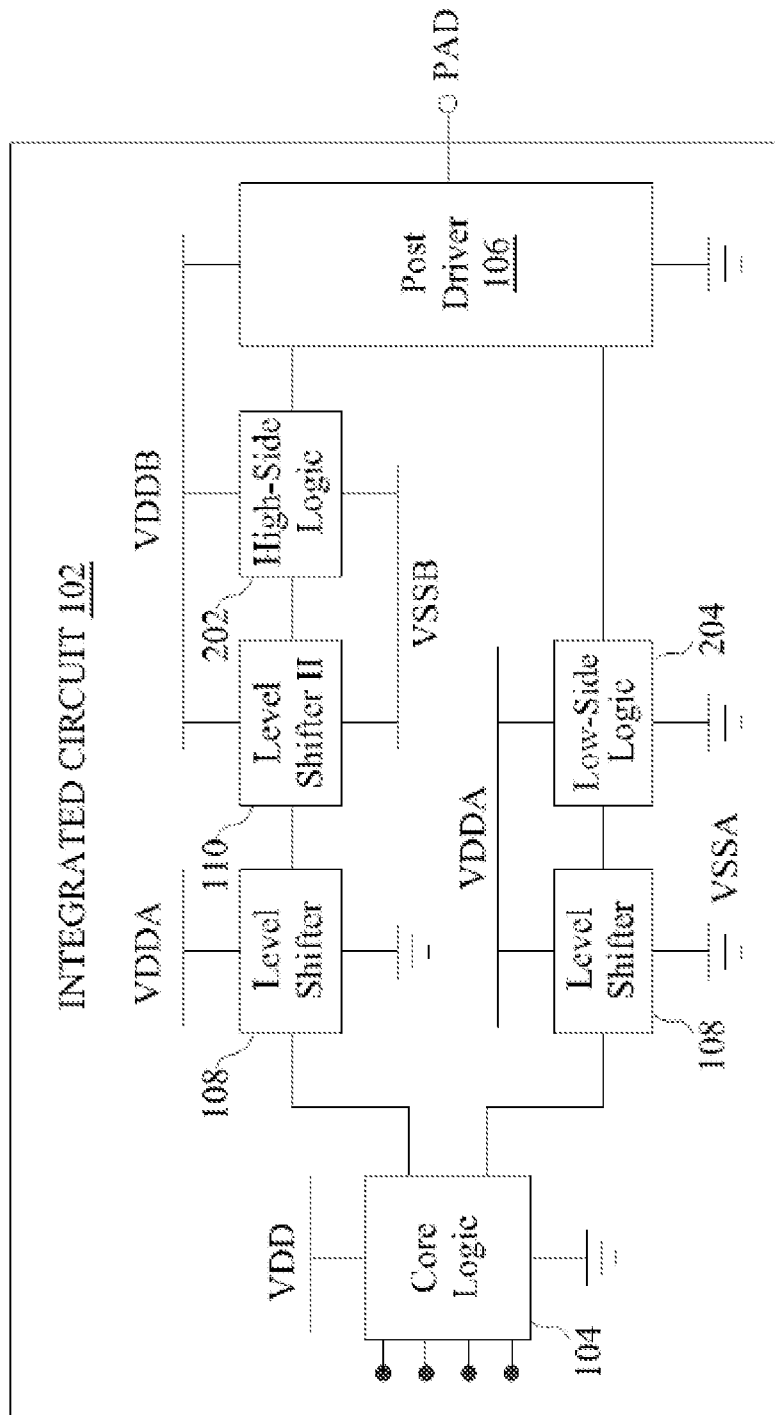
FIG. 2 is a diagram depicting an integrated circuit that utilizes multiple levels of level shifting to transition signals from a base voltage domain to a IO voltage domain, in accordance with embodiments.

FIG. 2 is a diagram depicting an integrated circuit that utilizes multiple levels of level shifting to transition signals from a base voltage domain to a IO voltage domain, in accordance with embodiments. An integrated circuit 102 includes core logic 104 that operates at a base voltage domain (VDD-VSS). A first set of level shifters 108 is configured to transition signals from the base voltage domain to a first voltage domain (VDDA-VSSA, e.g., 1.2 V-0.0 V) A second level shifter 110 is configured to transition signals from the first voltage domain to a second voltage domain (VDDB-VSSB, e.g., 3.0 V-1.8 V). High side logic 202 and low side logic 204 are configured to serve as an interface between the IO circuitry 106 (a post driver and IO pad), where the IO circuitry 106 operates in a high voltage domain (VDDB-VSS, e.g., 3.0 V-0.0 V). When a high voltage signal is to be output to the pad, the high side logic 202 is configured to apply the high voltage level of the high voltage domain (VDDB) to the IO circuitry 106, and when a low voltage signal is to be output to the pad, the low side logic 204 is configured to apply the low voltage level of the high voltage domain (VSS) to the IO circuitry 106. In the embodiment of FIG. 2, the second level shifter 110 includes self timing modules (indicated by the dashed outline) to improve performance speed while minimizing voltage overshoots that could damage transistors of the second level shifter 110.

Figure 3:
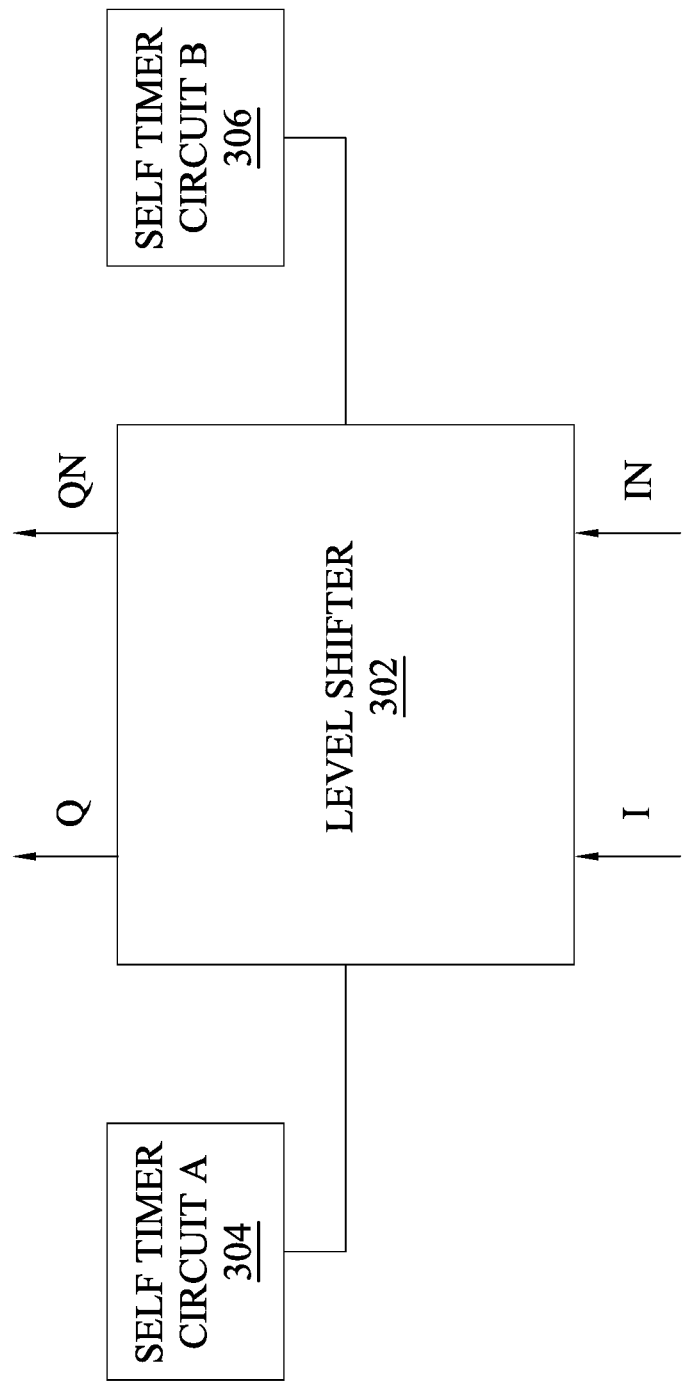
FIG. 3 is a block diagram depicting a level shifter that is responsive to self timer circuits in shifting a signal from a first voltage level to a second voltage level in accordance with embodiments.

FIG. 3 is a block diagram depicting a level shifter that is responsive to self timer circuits in shifting a signal from a first voltage level to a second voltage level in accordance with embodiments. A level shifter 302 receives differential input signals I, IN in a first voltage domain and transitions (shifts) those input signals I, IN to a second voltage domain for output at Q, QN. For example, where a rising signal is received at I and a corresponding falling signal is received at IN in the first voltage domain (VDD-VSS), the level shifter 302 provides a rising signal transition at Q and a falling signal transition at QN in the second voltage domain (VDDA-VSSA). To speed the production of outputs in the second voltage domain at Q, QN, self timing circuits 304, 306 provide voltage transition accelerator signals to pull up particular circuit nodes within the level shifter faster than the particular circuit nodes would otherwise charge (e.g., based on the input signals I, IN or signals at other nodes within the level shifter 302). For example, when I is rising, self timer circuit A 304 accelerates pulling up of a node that helps generate a corresponding rising signal at Q. And when IN is rising, self timer circuit B 306 accelerates pulling up of a node that helps generate a corresponding rising signal at QN, as described further herein.

Figure 4:
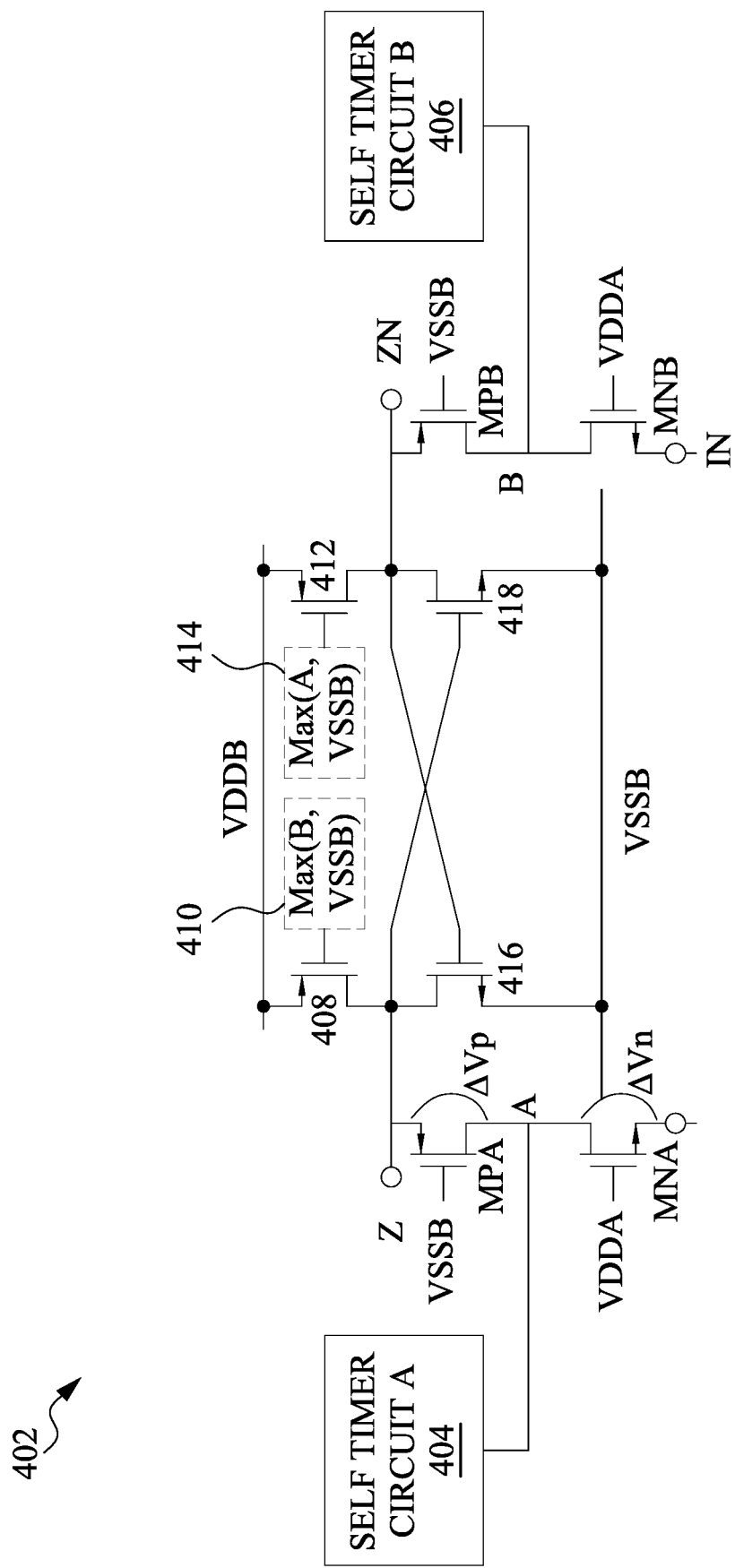
FIG. 4 is a block diagram depicting example details of a level shifter that is responsive to self timer circuits in accordance with embodiments.

FIG. 4 is a block diagram depicting example details of a level shifter that is responsive to self timer circuits in accordance with embodiments. The level shifter of FIG. 4 transitions signals from a first voltage domain (VDDA-VSSA) to a second voltage domain (VDDB-VSSB). Transistors of the level shifter 402 (MPA, MNA, MPB, MNB) are rated to experience no larger than $V_{Rated}$ (e.g., $_{Rated}$=1.2 V), where the difference between the maximum voltage in the second domain and the minimum voltage in the first domain is near or greater than $V_{Rated}$ (e.g., VDDB-VDDA=3.0 V-1.2 V=1.8 V>$V_{Rated}$=1.2 V). The level shifter 402 is responsive to self timing circuits 404, 406 that provide voltage transition accelerator signals that pull up specific nodes within the level shifter faster than those specific nodes would otherwise charge, with transistors MPA, MNA, MPB, MNB being sized (e.g., MPA relative to MNA, MPA being about ¼ the size of MNA in the example of FIG. 4, MPA 716 being about ¼ the size of MPB 718 in the example of FIG. 7) to avoid overshoots that could damage the transistors within the level shifter 402 (e.g., $\Delta V p, \Delta V n > V_{Rated}$).

Specifically, in the example of FIG. 4, when input signal I experiences a rising transition and IN a corresponding falling transition, node A is charged high and node B is pulled low, where node B is typically pulled low faster than node A is charged. Specifically, node B is charged by turning on a first charging transistor 408 by a first initiation signal 410 (Max(B, VSSB)) which is pulled low when node B is pulled low by input IN. The turning on of the first initiation signal allows current to flow from the source (VDDB) to output node Z and node A. To speed the charging of node A, which supports a high voltage at node Z, self timer circuit A 404 receives the first initiation signal 410 and provides a voltage transition accelerator signal to node A that speeds pulling up of node A (i.e., node A is pulled up faster than node A would otherwise be pulled up without self timer circuit A 404).

Conversely when input signal IN experiences a rising transition and I a corresponding falling transition, node B is charged high and node A is pulled low, where node A is typically pulled low faster than node B is charged. Specifically, node A is charged by turning on a second charging transistor 412 by a second initiation signal 414 (Max(A, VSSB)) which is pulled low when node A is pulled low by input I. The turning on of the second initiation signal allows current to flow from the source (VDDB) to output node ZN and node B. To speed the charging of node B, self timer circuit B 406 receives the second initiation signal 414 and provides a voltage transition accelerator signal to node B that speeds pulling up of node B.

In the example of FIG. 4, level shifter 402 includes a network of transistors (408, 412, MPA, MNA, MPB, MNB) configured to receive a signal at a first node (e.g., a falling transition at IN) in a first voltage domain and to generate a corresponding signal at a second node (e.g., a rising transition at A) in a second voltage domain during a transition period of time. A self timing circuit 404 is configured to receive an initiation signal (410) based on the signal at the first node (e.g., B is pulled down by IN) and generate a voltage transition accelerator signal (from 404 to A) that is used to pull up the second node (A) prior to the expiration of the transition period of time to accelerate generation of the corresponding signal at the second node (e.g., A is pulled up faster than it would be without the accelerator signal from 404).

The network of transistors, in one example, is further configured to receive a signal at a third node (e.g., a falling transition at I) in the first voltage domain and to generate a corresponding signal at a fourth node (e.g. a rising transition at B) in the second voltage domain. A second self timing circuit 406 receives a second initiation signal (414) based on the signal at the third node (e.g., A is pulled down by I) and generates a second voltage transition accelerator signal (from 406 to B) that is used to pull up the fourth node (B).

Figure 5:
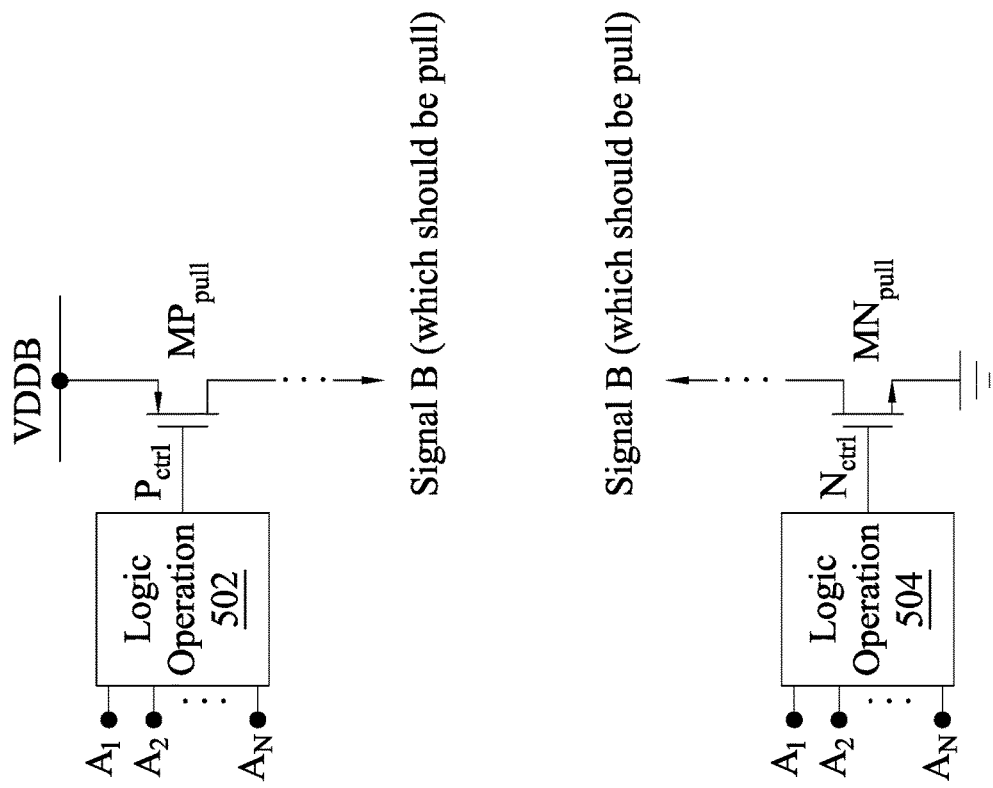
FIG. 5 depicts logic operations generating voltage transition accelerator signals in accordance with embodiments.

FIG. 5 depicts logic operations generating voltage transition accelerator signals in accordance with embodiments. In a first example, a self timing circuit 502 receives one or more signals (A1, A2, . . . AN) from elsewhere in the level shifter. A logic operation in the self timing circuit 502 determines a state of a control signal $P_{ctrl}$ that controls a transistor $MP_{pull}$. In the first example, a low control signal $P_{ctrl}$ turns on $MP_{pull}$ allowing current to flow from source VDDB to pull up a node.

In a second example, a self timing circuit 504 receives one or more signals (A1, A2, . . . AN) from elsewhere in the level shifter. A logic operation in the self timing circuit 504 determines a state of a control signal $N_{ctrl}$ that controls a transistor $MN_{pull}$. In the second example, a high control signal $N_{ctrl}$ turns on $MN_{pull}$ allowing current to flow from a node to a ground to pull the node down. In both the first and second examples, the logic operations at 502, 504 can be tailored to generate accelerator signals to aid desired circuit operation (e.g., accelerating the pulling up or down of particular nodes).

Figure 6:
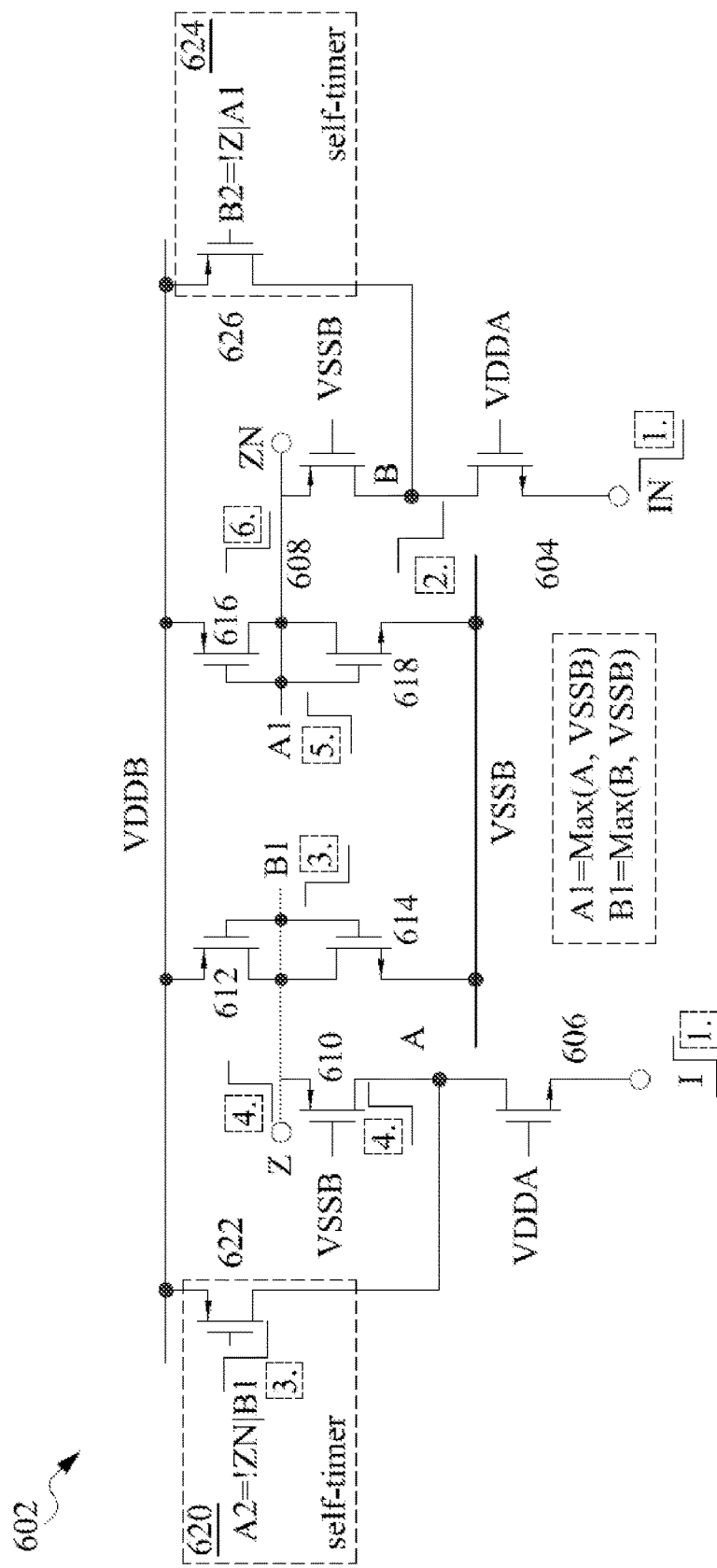
FIG. 6 is a diagram depicting a level shifter in accordance with an embodiment.

FIG. 6 is a diagram depicting a level shifter in accordance with an embodiment. The level shifter 602 includes a network of transistors (604, 606, . . . , 618) configured to receive input signals IN at a first node and I at a third node in a first voltage domain and to shift those input signals to a second voltage domain. The level shifter includes a first circuit path from I to Z through first transistor 606 and second transistor 610, where a second node A is between those transistors 606, 610. The level shifter includes a second circuit path from IN to ZN through third transistor 604 and fourth transistor 608, where a fourth node B is between those transistors 604, 608. A first control subcircuit includes transistors 612, 614 controlled by a first initiation signal B1, where a low signal at B1 pulls output node Z and second node A high, where B1 is set at Max(B, VSSB). A second control subcircuit includes transistors 616, 618 controlled by a second initiation signal A1, where a low signal at A1 pulls output node ZN and fourth node B high, where A1 is set at Max(A, VSSB).

A first self timing circuit 620 is configured to receive the first initiation signal (B1) and output ZN and generates a voltage transition accelerator signal (A2) to pull up the second node A prior to the period of time that the network of transistors (604, 606, . . . , 618) would take to pull up the second node A without the first self timing circuit 620 to accelerate generation of signal at the second node A. Specifically, a logic gate at the first self timing circuit 620 evaluates !ZN|B1 to provide the voltage transition accelerator signal to node pull up transistor 622 that releases current to the second node A, speeding charging of the second node A and correspondingly output node Z.

A second self timing circuit 624 is configured to receive the second initiation signal (A1) and output Z and generates a second voltage transition accelerator signal (B2) to pull up the fourth node B prior to the period of time that the network of transistors (604, 606, . . . , 618) would take to pull up the fourth node B without the second self timing circuit 624 to accelerate generation of signal at the fourth node B. Specifically, a logic gate at the second self timing circuit 624 evaluates !Z|A1 to provide the second voltage transition accelerator signal to node pull up transistor 626 that releases current to the fourth node B, speeding charging of the fourth node B and correspondingly output node ZN.

In one example operation, a rising transition signal is received at third node I and a falling transition signal is received at first node IN. The network of transistors (604, 606, . . . , 618) is configured to generate a corresponding signal at a second node A, a rising signal at second node A during a transition period of time (e.g., 0.5 ns). The falling signal at first node IN pulls fourth node B low. The first initiation signal (B1) goes low based on an evaluation of Max(B, VSSB), where B falls toward VSSA, which changes the output of the A2 logic function in the first self timing circuit 420 to low based on an evaluation of A2=!ZN|B1. That now low first voltage transition accelerator signal turns on node pull up transistor 622 allowing current to flow to second node A speeding its transition (and corresponding output node Z) from low to high (e.g., in 0.2 ns instead of 0.5 ns without first self timing circuit 620). Based on second node A transitioning to high, second initiation signal (A1) goes high based on an evaluation of Max(A, VSSB), which controls the second control subcircuit 616, 618 to pull output ZN low.

Figure 7:
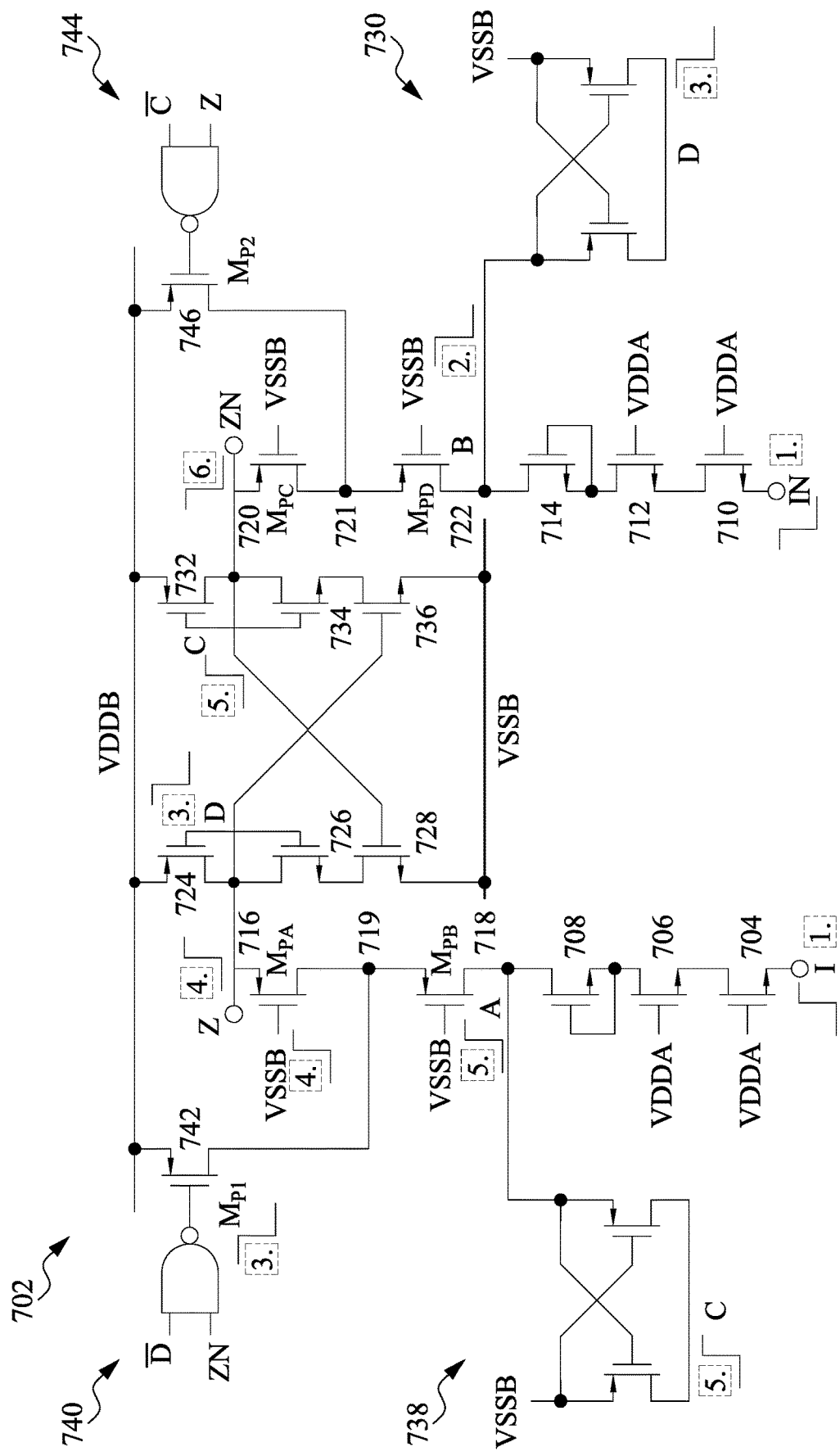
FIG. 7 is a diagram depicting a level shifter in accordance with another embodiment of the disclosure.

FIG. 7 is a diagram depicting a level shifter in accordance with another embodiment of the disclosure. The level shifter 702 includes a network of transistors (704, 706, . . . , 722) configured to receive input signals I at a first node and IN at a third node in a first voltage domain and to shift those input signals to a second voltage domain. The level shifter includes a first circuit path from I to Z through transistors 704, 706, 708, 718, 716, where a second node 719 sits between transistors 716, 718. The level shifter includes a second circuit path from IN to ZN through transistors 710, 712, 714, 722, 720, where a fourth node 721 sits between those transistors 720, 722. A first control subcircuit includes transistors 724, 726, 728 controlled by a first initiation signal D, where a low signal at D pulls output node Z and the second node 719 high, where D is set at Max(B, VSSB) at 730. A second control subcircuit includes transistors 732, 734, 736 controlled by a second initiation signal C, where a low signal at C pulls output node ZN and fourth node 721 high, where C is set at Max(A, VSSB) at 738.

A first self timing circuit 740 is configured to receive the first initiation signal (D) and output ZN and generates a voltage transition accelerator signal to pull up the second node 719 prior to the period of time that the network of transistors (704, 706, . . . , 722) would take to pull up the second node 719 without the first self timing circuit 740 to accelerate generation of signal at the second node 719. Specifically, a logic gate at the first self timing circuit 740 evaluates !D NAND ZN to provide the voltage transition accelerator signal to node pull up transistor 742 that releases current to the second node 719, speeding charging of the second node 719 and correspondingly output node Z.

A second self timing circuit 744 is configured to receive the second initiation signal (C) and output Z and generates a second voltage transition accelerator signal to pull up the fourth node 721 prior to the period of time that the network of transistors (704, 706, . . . , 722) would take to pull up the fourth node 721 without the second self timing circuit 744 to accelerate generation of signal at the fourth node 721. Specifically, a logic gate at the second self timing circuit 744 evaluates !C NAND Z to provide the second voltage transition accelerator signal to node pull up transistor 746 that releases current to the fourth node 721, speeding charging of the fourth node 721 and correspondingly output node ZN.

In one example operation, a rising transition signal is received at third node I and a falling transition signal is received at first node IN. The network of transistors (704, 706, . . . , 722) is configured to generate a corresponding rising transition signal at a second node 719. The falling signal at first node IN pulls node 721 low. The first initiation signal (D) goes low based on an evaluation of Max(B, VSSB) at 738, which changes the output of the logic function in the first self timing circuit 740 to low based on an evaluation of evaluates !D NAND ZN. That now low first voltage transition accelerator signal turns on node pull up transistor 742 allowing current to flow to second node 719 speeding its transition (and corresponding output node Z) from low to high, followed by node A via transistor 718. Based on node A transitioning to high, second initiation signal (C) goes high based on an evaluation of Max(A, VSSB), which controls the second control subcircuit 732, 734, 736 to pull output ZN low.

Figure 8:
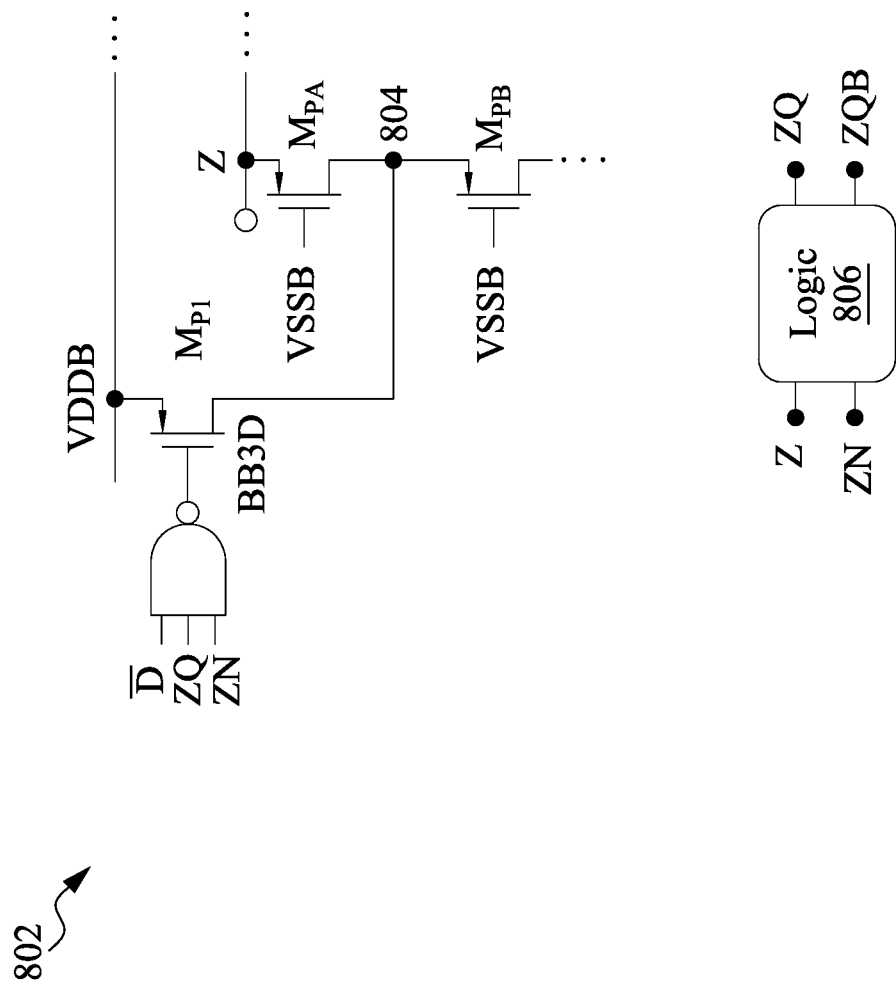
FIG. 8 is a diagram depicting a self timing circuit that is disabled during pull down operations in accordance with embodiments.

As noted above, pull down operations within a level shifter may occur faster than pull up operations, which in embodiments facilitates improvements provided by the self timing circuits described herein. And in some embodiments, the use of a self timing circuit during a pull down operation can result in a temporary short circuit that can result in undesirable power draws. FIG. 8 is a diagram depicting a self timing circuit that is disabled during pull down operations in accordance with embodiments. Specifically, a self timing circuit 802 generates a voltage transition accelerator signal BB3D that controls node pull up transistor MP1 that can provide current to node 804. Because node 804 typically transitions sufficiently fast when node 804 and corresponding output node Z are being pulled down such that that operation is not a bottleneck to performance of the level shifter, and because a temporary short circuit from VDDB to VSSB during such a pull down transition may cause unwanted power drain, the first self timing circuit 802 is configured to generate the voltage transition accelerator signal BB3D based on a ZQ input that disables the node pull up transistor MP1 during a pull down operation of node 804. Specifically, logic 806 includes an SR-latch that stores a last state of the output nodes Z, ZN. When the last state of output node Z is high, the logic 806 is configured to disable the node pull up transistor MP1 by causing the voltage transition accelerator signal to remain at a high level.

Figure 9:
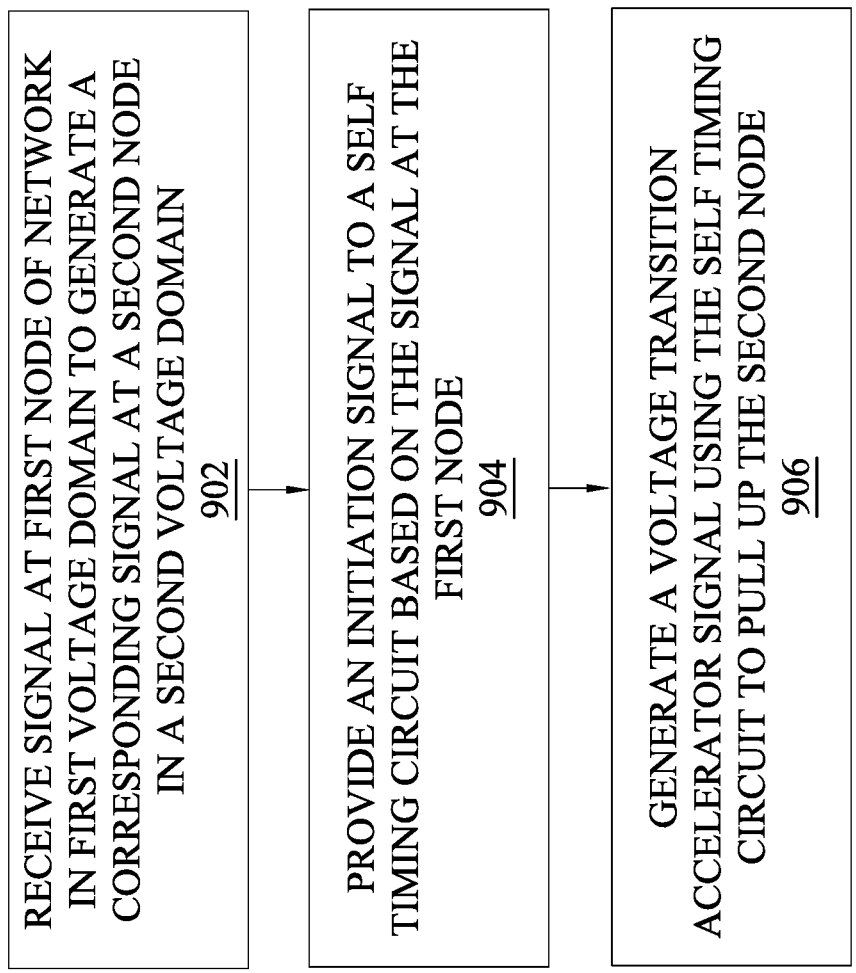
FIG. 9 is a flow diagram depicting a method of transitioning a signal from a first voltage domain to a second voltage domain in accordance with an embodiment.

FIG. 9 is a flow diagram depicting a method of transitioning a signal from a first voltage domain to a second voltage domain in accordance with an embodiment. While the flow diagram is described with reference to structures described above, it is understood that the method is applicable to many other structures as well. The method includes receiving a signal at a first node (IN) of a network of transistors (604, 606, 608, 610, 612, 614, 616, 618) in the first voltage domain (VDDA, VSSA) to generate a corresponding signal at a second node A in the second voltage domain (VDDB, VSSB) during a transition period of time. An initiation signal (B1) is provided to a self timing circuit (620) based on the signal at the first node (IN→B), and the self timing circuit (620) is used to generate a voltage transition accelerator signal (A2) that is used to pull up the second node (A) prior to the expiration of the transition period of time to accelerate generation of the corresponding signal at the second node (A).

Use of the various processes as described herein can provide a number of advantages. For example, use of the subject matter can provide high speed level shifting operations using transistors sized so as to not result in voltage overshoots that can damage level shifter transistors.

In one example, a level shifter includes a network of transistors configured to receive a signal at a first node in a first voltage domain and to generate a corresponding signal at a second node in a second voltage domain during a transition period of time. A self timing circuit is configured to receive an initiation signal based on the signal at the first node and to generate a voltage transition accelerator signal that is used to pull up the second node prior to the expiration of the transition period of time to accelerate generation of the corresponding signal at the second node.

In another example, a method of transitioning a signal from a first voltage domain to a second voltage domain includes receiving a signal at a first node of a network of transistors in the first voltage domain to generate a corresponding signal at a second node in the second voltage domain during a transition period of time. An initiation signal is provided to a self timing circuit based on the signal at the first node, and the self timing circuit is used to generate a voltage transition accelerator signal that is used to pull up the second node prior to the expiration of the transition period of time to accelerate generation of the corresponding signal at the second node.

In a further embodiment, an integrated circuit includes a logic circuit configured to operate in a first voltage domain and an input/output circuit configured to operate in a second voltage domain, the second voltage domain having a higher maximum voltage than the first voltage domain. A level shifter includes a network of transistors configured to receive a signal at a first node in the first voltage domain and to generate a corresponding signal at a second node in the second voltage domain during a transition period of time. The level shifter further includes a self timing circuit configured to receive an initiation signal based on the signal at the first node and to generate a voltage transition accelerator signal that is used to pull up the second node prior to the expiration of the transition period of time to accelerate generation of the corresponding signal at the second node.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A level shifter, comprising:
   a network of transistors configured to receive a signal at a first node in a first voltage domain and to generate a corresponding signal at a second node in a second voltage domain during a transition period of time, wherein the network of transistors are rated at a rating voltage and a difference between maximum and minimum voltages of the second voltage domain is greater than the rating voltage; and
   a self timing circuit connected to the second node and configured to receive an initiation signal based on the signal at the first node and generate a voltage transition accelerator signal that is used to pull up the second node prior to the expiration of the transition period of time.

2. The level shifter of claim 1, wherein the self-timing circuit includes a logic gate configured to determine when the voltage transition accelerator signal is generated.

3. The level shifter of claim 1, wherein the network of transistors is configured to receive a signal at a third node in the first voltage domain and to generate a corresponding signal at a fourth node in the second voltage domain; and wherein a second self timing circuit is configured to receive a second initiation signal based on the signal at the third node and generate a second voltage transition accelerator signal that is used to pull up the fourth node.

4. The level shifter of claim 1, wherein the level shifter is an overdrive level shifter.

5. The level shifter of claim 1, wherein a first circuit path includes a first transistor and a second transistor, wherein the second node is between the first transistor and the second transistor, and wherein a size of the first transistor relative to a size of the second transistor is configured to prevent voltage overshoot across the first transistor by more than a threshold amount during a level shifting operation.

6. The level shifter of claim 1, wherein the self timing circuit is configured to generate the voltage transition accelerator signal based on the initiation signal and an output node signal level.

7. The level shifter of claim 1, wherein the initiation signal is based on the signal at the first node and a base voltage of the level shifter.

8. The level shifter of claim 7, wherein the base voltage of the level shifter is a higher voltage than a low voltage of the first voltage domain.

9. The level shifter of claim 1, wherein the voltage transition accelerator signal controls a node pull up transistor that releases current to the second node based on the voltage transition accelerator signal.

10. The level shifter of claim 9, wherein an output node is associated with the second node; and wherein the self timing circuit is configured to disable a node pull up transistor when the output node associated with the second node is transitioning from low to high.

11. A method of transitioning a signal from a first voltage domain to a second voltage domain, comprising:

receiving a signal at a first node of a network of transistors in the first voltage domain to generate a corresponding signal at a second node in the second voltage domain during a transition period of time, wherein a difference between maximum and minimum voltages of the second voltage domain is greater than a rating voltage of the network of transistors;

providing an initiation signal to a self timing circuit based on the signal at the first node; and using the self timing circuit to generate a voltage transition accelerator signal that is used to pull up the second node prior to the expiration of the transition period of time, wherein the self timing circuit is connected to the second node.

12. The method of claim 11, further comprising:

receiving a signal at a third node in the first voltage domain to generate a corresponding signal at a fourth node in the second voltage domain; and using a second self timing circuit to generate a second voltage transition accelerator signal that is used to pull up the fourth node.

13. The method of claim 12, wherein the first node is in a first level transition path that comprises a series of transistors between the first node and a first output node, wherein the fourth node is also in the first level transition path between the first node and the first output node, wherein the second node is in a second level transition path that comprises a second series of transistors between the second node and a second output node, and wherein the third node is also in the second level transition path between the second node and the second output node.

14. The method of claim 13, wherein, when the first node transitions from high to low, the fourth node is pulled down via a transistor on the first level transition path, wherein a control node transitions low based on the fourth node being pulled down, and wherein the initiation signal is based on the control node transitioning low.

15. The method of claim 14, wherein the voltage transition accelerator signal is generated based on the initiation signal and a voltage at the first output node.

16. The method of claim 14, wherein the control node selects one of a voltage at the fourth node or a base voltage for the second voltage domain.

17. The method of claim 11, further comprising:

disabling a node pull up transistor when an output node associated with the second node is transitioning from low to high.

18. An integrated circuit, comprising:

a logic circuit configured to operate in a first voltage domain;

an input/output circuit configured to operate in a second voltage domain, the second voltage domain having a higher maximum voltage than the first voltage domain; and a level shifter, comprising:

a network of transistors configured to receive a signal at a first node in the first voltage domain and to generate a corresponding signal at a second node in the second voltage domain during a transition period of time, wherein a difference between the maximum voltage of the second voltage domain and a minimum voltage of the second voltage domain is greater than a rating voltage of the network of transistors; and a self timing circuit connected to the second node and configured to receive an initiation signal based on the signal at the first node and generate a voltage transition accelerator signal that is used to pull up the second node prior to the expiration of the transition period of time.

19. The integrated circuit of claim 18, wherein the level shifter further comprises a high side logic component that is configured to select one of the maximum and minimum voltages of the second voltage domain to apply to an output line.

20. The integrated circuit of claim 18, wherein the logic circuit includes a first level shifter that precedes said level shifter, the first level shifter being configured to transition signals from a base voltage domain to the first voltage domain.

* * * * *